United States Patent [19]

Hirose

[11] Patent Number: 4,977,426

[45] Date of Patent: Dec. 11, 1990

[54] PROJECTION EXPOSURE APPARATUS

[75] Inventor: Ryusho Hirose, Kawasaki, Japan

[73] Assignee: Canon Kabushiki Kaisha, Tokyo, Japan

[21] Appl. No.: 212,148

[22] Filed: Jun. 24, 1988

Related U.S. Application Data

[63] Continuation of Ser. No. 6,567, Jan. 23, 1987, abandoned, which is a continuation of Ser. No. 682,232, Dec. 17, 1984, abandoned.

[30] Foreign Application Priority Data

| Dec. 28, 1983 | [JP] | Japan | 58-245904 |
| Jul. 9, 1984 | [JP] | Japan | 59-142059 |
| Jul. 9, 1984 | [JP] | Japan | 59-142060 |
| Nov. 28, 1984 | [JP] | Japan | 59-252277 |

[51] Int. Cl.$^5$ .............. G03B 27/42; G03B 27/54
[52] U.S. Cl. ................................ 355/53; 355/67
[58] Field of Search .............. 355/53, 55, 67, 71; 350/1.1, 471, 474, 475, 1.3

[56] References Cited

U.S. PATENT DOCUMENTS

| 2,983,193 | 5/1961 | Schade | 350/471 |
| 3,633,985 | 1/1972 | Mouchart | 350/1.3 |
| 3,779,788 | 12/1973 | Keafer, Jr. et al. | 350/1.1 X |
| 4,132,479 | 1/1979 | Dubroeucq et al. | 355/71 |
| 4,461,546 | 7/1984 | Muffoletto et al. | 350/453 |
| 4,493,555 | 1/1985 | Reynolds | 355/55 X |
| 4,703,166 | 10/1987 | Bruning | 250/201 |
| 4,811,055 | 3/1989 | Hirose | 355/53 |

FOREIGN PATENT DOCUMENTS 0066053 12/1982 European Pat. Off. .
8124300 7/1983 France .

OTHER PUBLICATIONS

Fused Silica Transmits Ultraviolet Light Electronics, vol. 39, No. 4, Feb. 21, 1962 (p. 216).
Synthetic Crystals and Polarizing Materials, "Optica Acta", vol. 9, No. 3, Jul. 1962, pp. 205-222.
Mandler, "Design of Basic Double Gauss Lenses," SPIE, vol. 237, pp. 222-232, 1980.
Cox, "Photographic Optics," pp. 240-248, 1966.
Buckley, "Expanding the Horizons of Optical Projection Lithography," Solid State Technology, pp. 77-82, 1982.
Attainment of the Theoretical Minimum Input Power of Injection Locking of an Unstable-Resonator KrF Laser, (Bigio et al.), "Optics Letters", vol. 6, No. 7, pp. 336-338 (1981).
Injection-Locked, Narrow-Band KrF Discharge Laser Using an Unstable Resonator Cavity, (Goldbar et al.), "Optics Letters", vol. 1, No. 6, pp. 199-201 (1977).
Grazing Angle Tuner for CW Lasers, (German), "Applied Optics", vol. 20, No. 18, pp. 3168-3171 (1981).
Coherent Radiation Generation at Short Wavelengths VUV and XUV Pulses, (Bradley) (1978).
Study on Laser, vol. 8, No. 6, pp. 69-71, Nov. 1980, (Photo-Etching of PMMA by Excimer Laser).

Primary Examiner—L. T. Hix
Assistant Examiner—D. Rutledge
Attorney, Agent, or Firm—Fitzpatrick, Cella, Harper & Scinto

[57] ABSTRACT

A projection exposure apparatus for projecting, through a refracting optical system, a pattern formed on an original such as a mask or reticle onto a wafer. The projection exposure apparatus includes a light source for providing an excimer laser beam to illuminate the original. The refracting optical system includes a plurality of lenses each of which is made of fused silica (SiO$_2$) or calcium fluoride (CaF$_2$).

4 Claims, 12 Drawing Sheets

PROJECTION EXPOSURE APPARATUS

This application is a continuation of application Ser. No. 006,567, filed Jan. 23, 1987, now abandoned, which was a continuation of application Ser. No. 682,232 filed Dec. 17, 1984, now abandoned.

BACKGROUND OF THE INVENTION

This invention relates to a projection exposure apparatus for use in the manufacture of semiconductor circuit devices and, more particularly, to a projection exposure apparatus using an excimer laser as an illumination source for manufacturing semiconductor circuit devices.

In projection exposure apparatuses for use in the manufacture of semiconductor integrated circuit devices such as ICs, LSIs, etc., a projection system such as a lens for exposing a silicon wafer to a pattern for the manufacture of the integrated circuit must have a very high resolving power.

It is known that the resolution in the image projection by the projection lens can generally be improved with the use of a shorter wavelength. For this reason, illumination sources emitting shorter wavelengths are usually employed. For example, a wavelength of 436 nm or 365 nm by an Hg lamp is currently used in most projection exposure apparatuses.

Excimer lasers (excited dimer lasers) providing short wavelengths are known. The excimer lasers use, as their lasing media, gases of ArF, KrCl, KrF, XeBr, XeCl, XeF, etc. According to the lasing medium used, the excimer laser produces light of a single wavelength, or a very narrow wavelength range within the region of 150 nm–400 nm, which is pulseoscillated at a repetition frequency of 200–300 Hz.

Application of the excimer laser to the photolithography is described in "Study on Laser" vol. 8, No. 6, November 1980, pp. 69–71 ("PhotoEtching of PMMA by Excimer Laser"), published by Japanese Laser Society.

SUMMARY OF THE INVENTION

It is a primary object of the present invention to provide a projection exposure apparatus having an excimer laser as a light source for the exposure.

It is another object of the present invention to provide a projection exposure apparatus with a projection optical system having suitable characteristics for use with an excimer laser.

Briefly, according to the present invention, there is provided a projection exposure apparatus having a light source for providing an excimer laser beam and an imaging system comprising a plurality of lens elements each of which is made of a glass material such as silica, calcium fluoride, etc. which is transmissive to the excimer laser beam and has a refracting power relative to the excimer laser beam.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
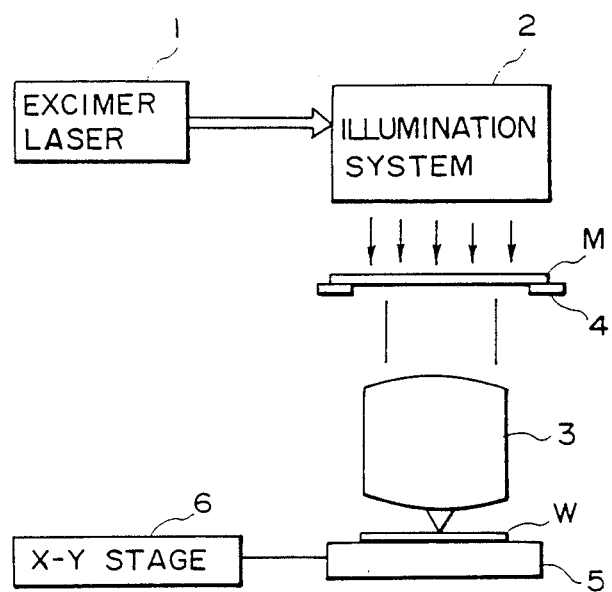
FIG. 1 is a schematic and diagrammatic view showing a projection exposure apparatus according to one embodiment of the present invention.

Referring first to FIG. 1 showing a projection exposure apparatus according to a first embodiment of the present invention, the projection exposure apparatus includes an excimer laser 1 as a light source. A laser beam emitted from the excimer laser 1 is directed to an illumination system 2 for uniformly illuminating an original M. The illumination optical system 2 comprises at least one lens element made of a glass material which is transmissive to the excimer laser beam and has a refracting power relative to the excimer laser. The original M is a mask or reticle comprising a flat parallel-plane glass plate made of a silica glass material or the like which is transmissive to the excimer laser beam. A circuit pattern is formed on the original M by using a non-transparent metallic material such as chrome. A reduction imaging system 3 is provided to project the circuit pattern formed on the original M onto a wafer W. This imaging system 3 comprises a plurality of lens elements each of which is made of a glass material such as fused silica or calcium fluoride which is transmissive to the excimer laser beam. For the purpose of executing a plurality of circuit pattern exposure operations in the manufacture of an integrated circuit, the distortion, among various optical aberrations, of the imaging system 3 has been corrected substantially perfectly. Since, however, an excimer laser having a single wavelength or a very narrow wavelength range is used as the exposure light, the imaging system 3 does not include any lenses cemented to each other and having different refractive indices or dispersion characteristics for correcting on-axis chromatic aberrations. The original M is supported by a holder 4, while the wafer W is supported by a wafer chuck 5. The wafer chuck 5 is adapted to be stepwisely moved by an X-Y step stage 6.

The light from the excimer laser 1 illuminates the original M through the illumination system 2 so that the pattern on the original M is projected onto a portion of the wafer W surface by the imaging system 3 at a reduced magnification. After completion of exposure, the wafer W is moved through a one-step distance by the X-Y step stage 6 so that another portion of the wafer W surface is positioned in alignment with the imaging system 3. This portion of the wafer surface is subsequently exposed to the pattern on the original M. In this manner, regions on the wafer surface are sequentially exposed, so that the exposure operation to the entire surface of the wafer is completed.

Embodied forms of the imaging optical system 3 will now be described. Each of the embodied forms of the imaging optical system 3 has been designed to be used with an excimer laser having a main emitting spectrum of 248.5 nm wavelength and having been injection-locked so that it provides a laser beam of a very narrow wavelength range about 248.5 nm.

Figure 2:
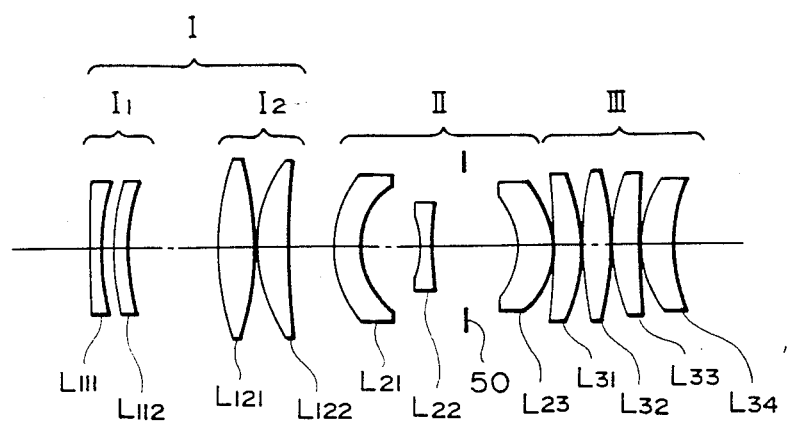
FIG. 2 is a cross-sectional view showing an imaging optical system of the apparatus of FIG. 1.
Figure 3:
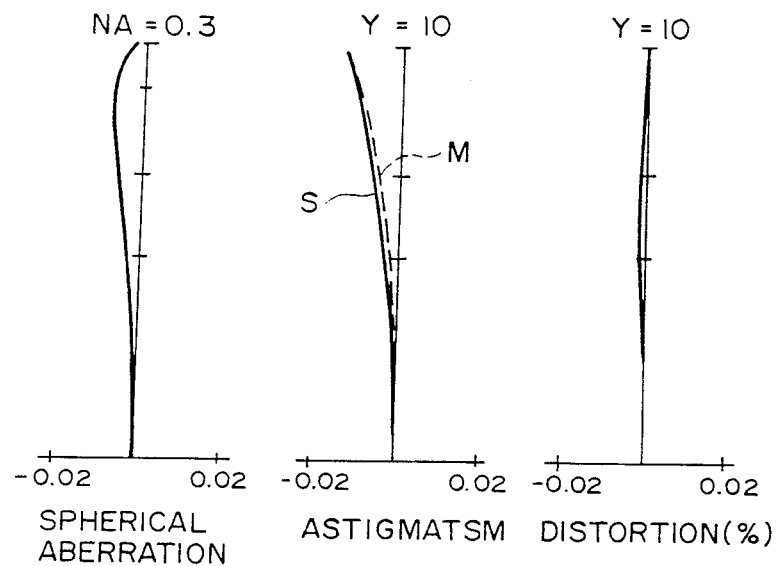
FIGS. 3–7 are plots showing aberrations in numerical examples 1–5 according to the FIG. 2 embodiment.
Figure 3:
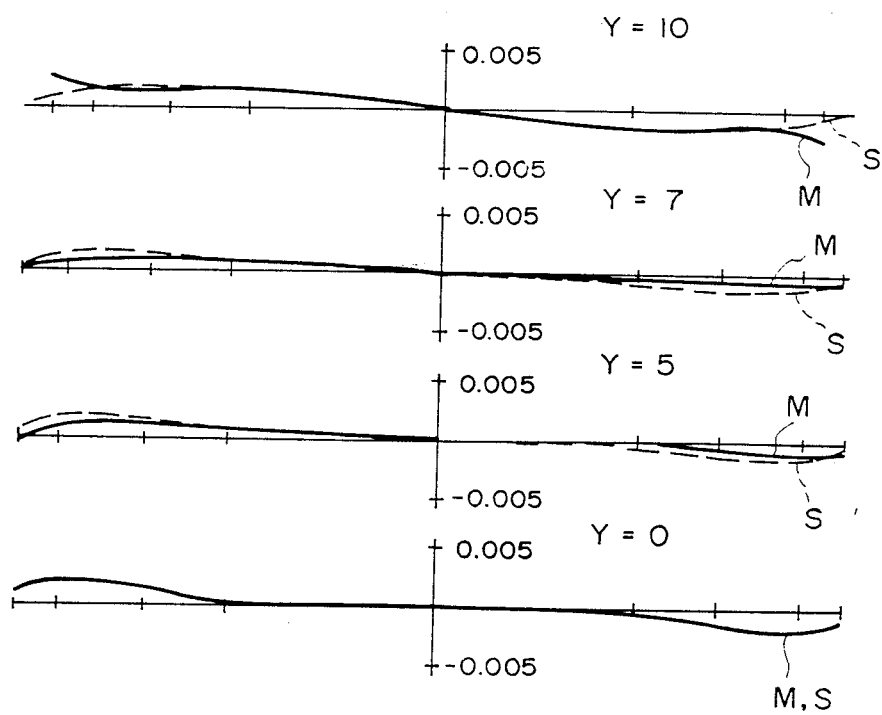
Figure 4:
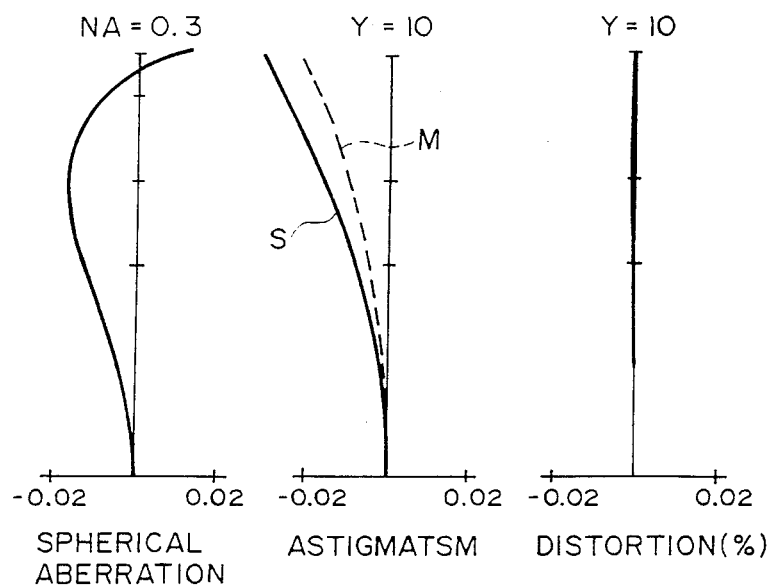
Figure 4:
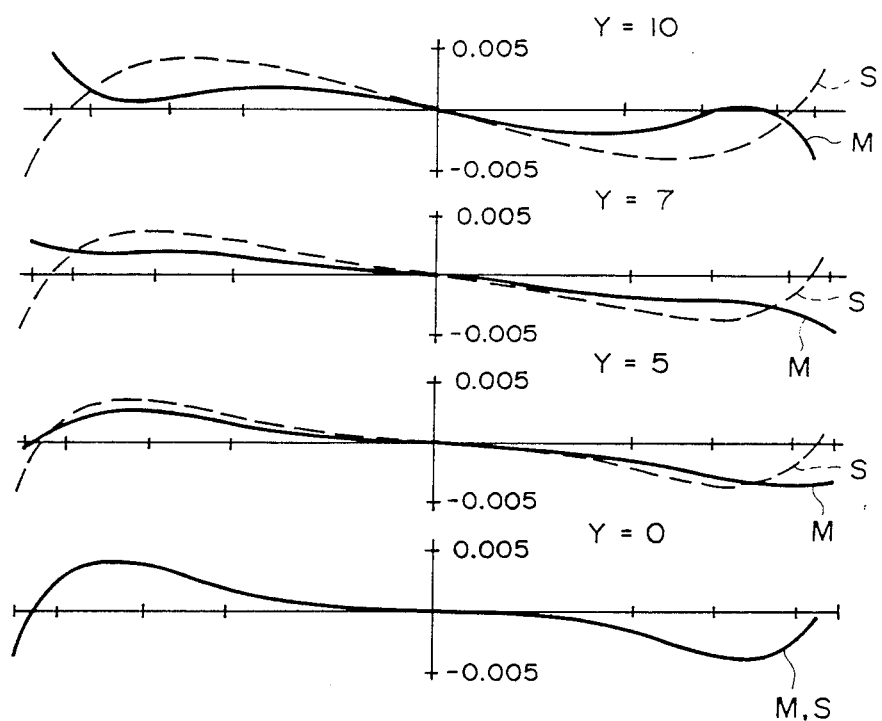
Figure 5:
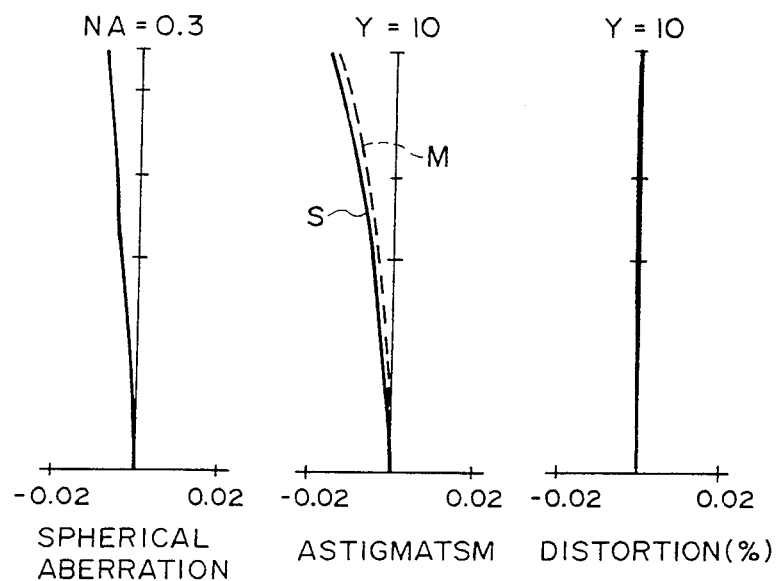
Figure 5:
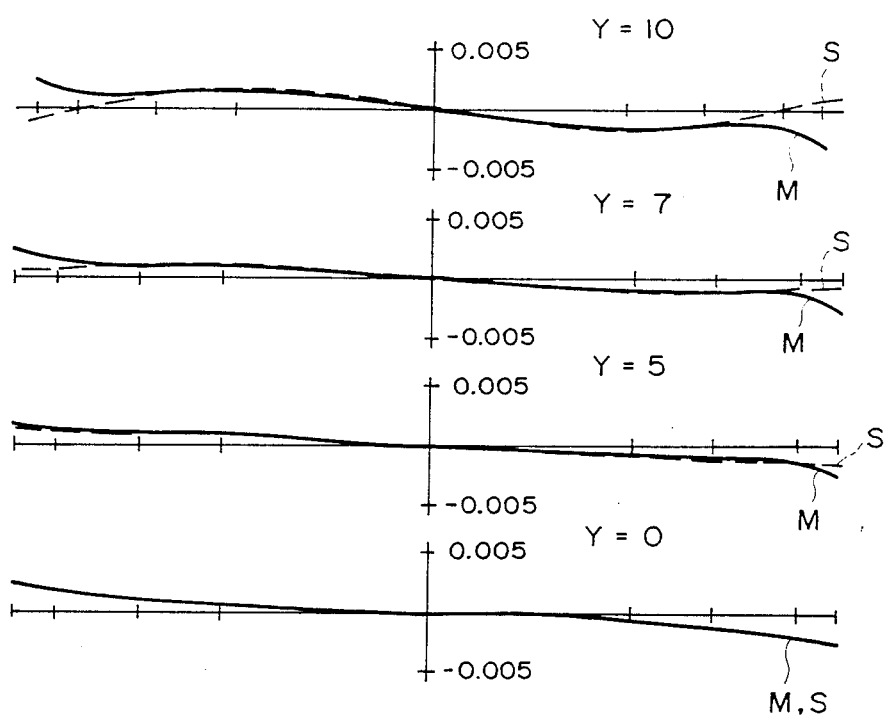
Figure 6:
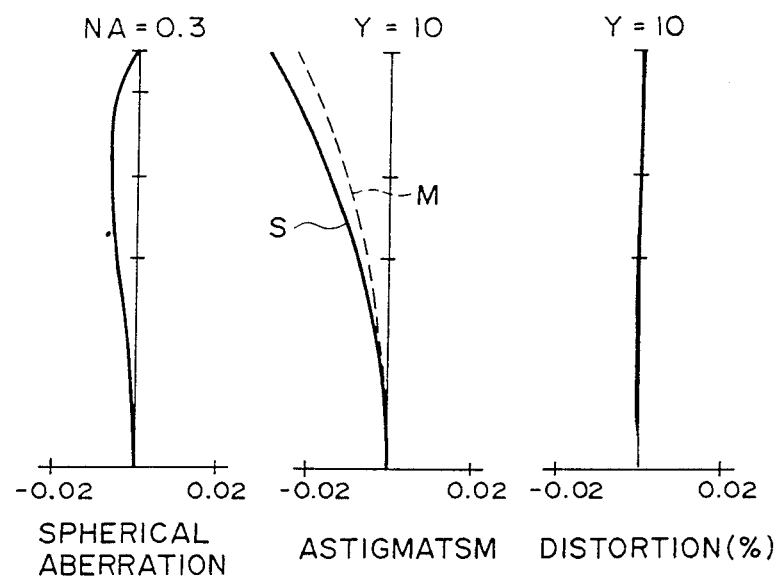
Figure 6:
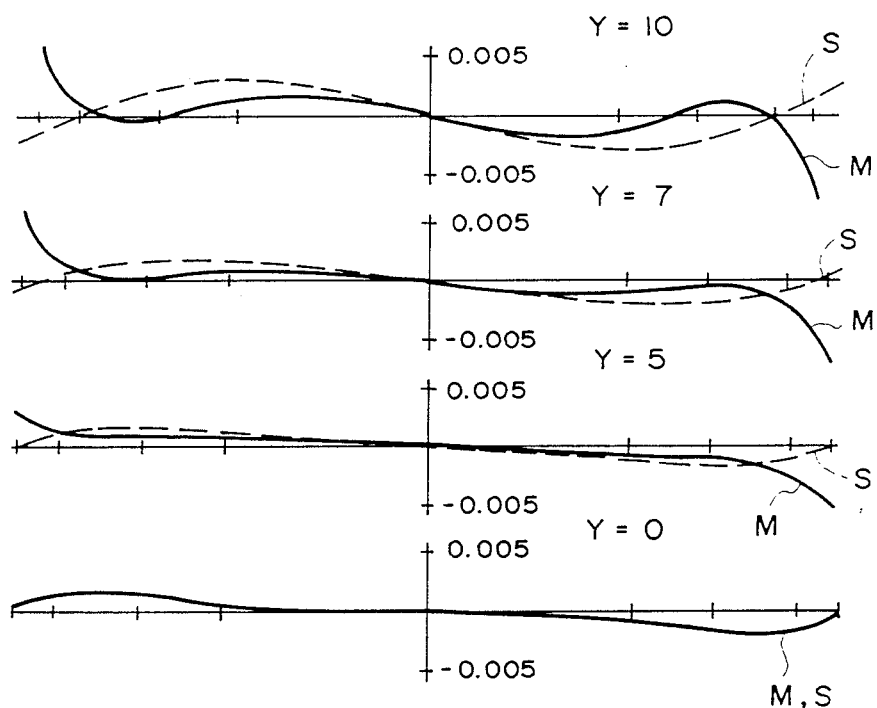
Figure 7:
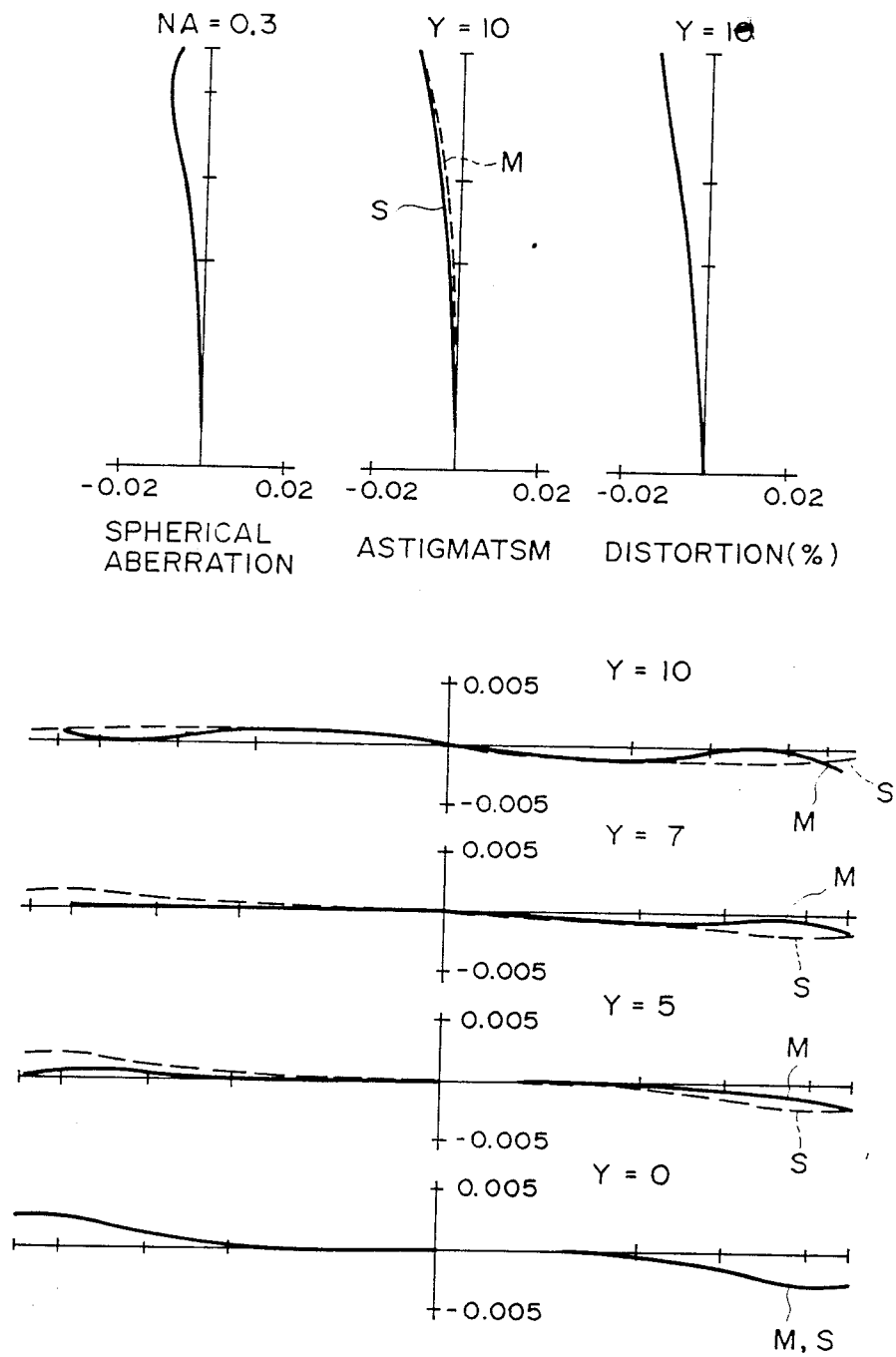

Referring first to FIG. 2 showing a first one of the embodied forms of the imaging system 3, the first embodiment imaging system includes, in the order from the object side to the image plane side, a first lens group I of a positive refracting power, a second lens group II of a negative refracting power and a third lens group III of a positive refracting power. The first lens group I comprises a first lens subgroup $I_1$ of a negative refracting power and a second lens sub-group $I_2$ of a positive refracting power. The first lens sub-group $I_1$ comprises a lens $L_{111}$ of a negative refracting power and a meniscus type lens $L_{112}$ of a negative refracting power and having a convexed surface facing to the object side. The second lens sub-group $I_2$ comprises a lens element $L_{121}$ of biconvex type and at least one meniscus lens $L_{122}$ having a convexed surface facing to the object side. The second lens group II comprises a meniscus type lens $L_{21}$ of a negative refracting power and having a convexed surface facing to the object side, the lens $L_{22}$ of a negative refracting power, and a meniscus type lens $L_{23}$ of a negative refracting power and having a convexed surface facing to the image plane side. The third lens group III comprises a meniscus type lens $L_{31}$ of a positive refracting power and having a convexed surface facing to the image plane side, a biconvex type lens $L_{32}$, a positive refracting lens $L_{33}$ having a convexed surface facing to the object side, and a meniscus type positive refracting lens $L_{34}$ having a convexed surface facing to the object side The lens $L_{22}$ satisfies the following condition:

$$|R_{2F}| < |R_{2R}| \qquad (1)$$

wherein $R_{2F}$, $R_{2R}$ are the curvature radii of the surfaces of the lens $L_{22}$ facing to the object side and the image plane side, respectively.

With the above arrangement, the aberrations have been corrected satisfactorily. Particularly, a good imaging performance is obtained at a projection ratio 1:5 and an angle of view not greater than $14 \times 14$ mm.

Each component of this imaging system will now be described in more detail.

The first lens sub-group $I_1$ is provided by the negative lens $L_{111}$ and the negative lens $L_{112}$ of meniscus type having a convexed surface facing to the object side. By this, the distortion can be corrected satisfactorily over the entire picture plane so that the mask pattern can be written on the wafer without distortion. Further, these two lenses $L_{111}$ and $L_{112}$ suitably share the negative refracting power of the first lens sub-group $I_1$ with each other. This is effective to realize a wider angle of view and therefore an enlargement of the exposure area, thus improving the throughput.

The lens $L_{111}$ may be of a meniscus type having a convexed surface facing to the object side, as the lens $L_{112}$, or may be of a biconcave type. In each case, the aberrations can be corrected satisfactorily.

The second lens sub-group $I_2$ is provided by the biconvex lens $L_{121}$ and the meniscus type positive lens $L_{122}$ comprising at least one component and having a convexed surface facing to the object side. With this arrangement, the inwardly oriented coma and halo caused by the first lens sub-group $I_1$ are corrected so that a higher resolving power is ensured.

The lens $L_{122}$ may be provided by a single component or two or more components. If two or more lens components are employed, the coma and halo can be more satisfactorily corrected.

The second lens group II is provided by the meniscus type negative lens $L_{21}$ having a convexed surface facing to the object side, the negative lens $L_{22}$ and the meniscus type negative lens $L_{23}$ having a convexed surface facing to the image plane side. With this arrangement, negative spherical aberration and sagittal flare in the area from an intermediate region to a marginal region of the picture plane, caused by the second lens sub-group $I_2$, are corrected satisfactorily. More particularly, the negative spherical aberration and halo caused by the second lens subgroup $I_2$ are corrected by the lens $L_{22}$, while the sagittal flare in the marginal area of the picture plane is corrected by the lenses $L_{21}$ and $L_{23}$.

The above-described arrangement of the second lens group II leads to excessive correction relative to a portion of the off-axis rays which is above the principal ray. This may cause an outwardly oriented coma. In view of this, the third lens group III is provided by the meniscus type positive lens $L_{31}$ having a convexed surface facing to the image plane side, the biconvex lens $L_{32}$ and the two meniscus type lenses $L_{33}$ and $L_{34}$ of positive refracting power. This is effective to ensure a balanced correction of the outwardly oriented coma, distortion and curvature of field appearing in an area from the intermediate region to the marginal region of the picture plane, which are caused by the second lens group.

Equation (1) as set forth in the foregoing is a condition for increasing the refracting of power the surface of the lens $L_{22}$ facing to the object side as compared with the surface thereof facing to the image plane side. By this, the sagittal flare at the marginal area of the picture plane and the spherical aberration about an numerical aperture 0.3 are corrected satisfactorily. If the condition (1) is not satisfied, sufficient correction of the spherical aberration and sagittal flare would be difficult to assure.

The lens $L_{22}$ may be of biconcave type or of meniscus type having a convexed surface facing to the image plane side, as long as the above condition (1) is satisfied.

If the lens $L_{111}$ of the first lens sub-group $I_1$ is of biconcave type, it is preferable to provide the lens $L_{22}$ by a meniscus lens having a convexed surface facing to the image plane side, from the viewpoint of aberration correction.

While the imaging system does provide a satisfactory performance when the foregoing specifications are realized, better results are obtainable when the following conditions are satisfied:

$$0.85 < |f_1/f_2| < 2.2 \qquad (2)$$

$$0.75 < |f_3/f_2| < 1.4 \qquad (3)$$

$$1.4 < |f_{11}/f_{12}| < 2.5 \qquad (4)$$

$$1.2 < f_{111}/f_{11} < 2.1 \qquad (5)$$

$$|R_{1F}| > |R_{1R}| \qquad (6)$$

wherein $f_1$, $f_2$ and $f_3$ are focal lengths of the first, second and third lens groups I, II and III, respectively; $f_{11}$ and $f_{12}$ are focal lengths of the first and second lens subgroups $I_1$ and $I_2$; $f_{111}$ is the focal length of the lens $L_{111}$; $R_{1F}$ and $R_{1R}$ are curvature radii of the surfaces of the lens $L_{111}$ facing to the object side and the image plane side, respectively.

Inequalities (2) and (3) are conditions for suitably setting the refracting powers of the lens groups, as the basic lens performance, to thereby ensure satisfactory correction of the curvature of field over the entire picture plane. If the lower limit value is exceeded, the Petzval's sum increases so that correction of the curvature of field becomes insufficient. If, on the other hand, the upper limit value is exceeded, correction of the curvature of field becomes excessive. In these cases, therefore, satisfactory correction of the aberrations over the entire picture plane would be difficult.

Inequality (4) is a condition for achieving, under the refracting power arrangement according to the conditions (2) and (3), correction of the distortion caused by the first lens sub-group $I_1$, correction of inwardly oriented coma and halo caused by the second lens sub-group $I_2$, and suppression of the curvature of field over the entire picture plane, to thereby improve the resolving power. If the lower limit value of the condition (4) is exceeded, correction of the curvature of field becomes insufficient. If, on the other hand, the upper limit value is exceeded, correction of the curvature of field becomes excessive.

Inequality (5) is a condition for suitably setting the share, in the negative refracting power, of the lens $L_{111}$ relative to the first lens sub-group $I_1$ to correct distortion satisfactorily. If the lower limit value of the condition (5) is exceeded, correction of the distortion becomes insufficient and, if the upper limit value is exceeded, correction of the distortion becomes excessive.

Inequality (6) is a condition for lowering the refracting power of the surface of the lens $L_{111}$ facing the object side as compared with that of the surface thereof facing to the image plane side, to thereby more satisfactorily correct the distortion over the entire picture plane. If the condition (6) is not satisfied, correction of the distortion disadvantageously becomes insufficient.

In a case where each of or one of the lenses $L_{33}$ and $L_{34}$ of the third lens group III is provided by two or more lens components to suppress the share, in the refracting power, of each lens element, the curvature of field and coma can be more satisfactorily corrected over the entire picture plane and, therefore, a higher resolving power can be attained.

As described above, the imaging system according to one embodiment of the present invention realizes a projection optical system for use in a projection exposure apparatus, having a high resolving power and a superior performance.

Numerical examples of the imaging system will be shown in the following part of this Specification. In the following Numerical Examples, Ri is the radius of curvature of the "i-th" lens surface in the order from the object side, Di is the lens thickness or air space of the "i-th" element in the order from the object side, and Ni is the index of refraction of the glass material of the "i-th" lens in the order from the object side.

The glass material was a fused silica ($SiO_2$) which showed an index of refraction 1.521130 at a wavelength 248.5 nm.

The following numerical examples were under the conditions of projection ratio 1:5, numerical aperture NA=0.3, and a picture plane area of 14×14.

| Numerical Example 1 | | | |
|---|---|---|---|
| | R | D | GLASS |
| 1 | 2000.527 | 8.00 | $SiO_2$ |
| 2 | 215.968 | 6.85 | |
| 3 | 211.060 | 8.00 | $SiO_2$ |
| 4 | 128.641 | 60.00 | |
| 5 | 195.942 | 24.00 | $SiO_2$ |
| 6 | −218.473 | 1.00 | |
| 7 | 99.751 | 20.00 | $SiO_2$ |
| 8 | 388.304 | 30.00 | |
| 9 | 76.621 | 20.00 | $SiO_2$ |
| 10 | 50.484 | 40.00 | |
| 11 | −67.422 | 12.00 | $SiO_2$ |
| 12 | 292.877 | 60.00 | |
| 13 | −48.915 | 20.00 | $SiO_2$ |
| 14 | −67.129 | 1.00 | |
| 15 | −387.231 | 18.00 | $SiO_2$ |
| 16 | −117.983 | 1.00 | |
| 17 | 307.379 | 16.50 | $SiO_2$ |
| 18 | −238.794 | 1.00 | |
| 19 | 139.999 | 18.50 | $SiO_2$ |
| 20 | 1444.435 | 1.00 | |
| 21 | 86.822 | 20.00 | $SiO_2$ |
| 22 | 102.183 | | |

| Numerical Example 2 | | | |
|---|---|---|---|
| | R | D | GLASS |
| 1 | −856.710 | 8.00 | $SiO_2$ |
| 2 | 195.588 | 6.82 | |
| 3 | 256.890 | 8.00 | $SiO_2$ |
| 4 | 100.855 | 75.50 | |
| 5 | 229.819 | 24.00 | $SiO_2$ |
| 6 | −156.275 | 1.00 | |
| 7 | 111.478 | 15.00 | $SiO_2$ |
| 8 | 300.960 | 2.75 | |
| 9 | 195.798 | 17.00 | $SiO_2$ |
| 10 | 451.070 | 3.35 | |
| 11 | 96.357 | 42.00 | $SiO_2$ |
| 12 | 45.106 | 15.00 | |
| 13 | −117.115 | 12.00 | $SiO_2$ |
| 14 | −168.640 | 22.00 | |
| 15 | −43.270 | 40.00 | $SiO_2$ |
| 16 | −79.931 | 4.00 | |
| 17 | −9783.000 | 18.00 | $SiO_2$ |
| 18 | −117.930 | 1.95 | |
| 19 | 423.480 | 16.50 | $SiO_2$ |
| 20 | −270.027 | 2.00 | |
| 21 | 170.348 | 18.50 | $SiO_2$ |
| 22 | 329.598 | 25.00 | |
| 23 | 81.424 | 20.00 | $SiO_2$ |
| 24 | 107.270 | | |

| Numerical Example 3 | | | |
|---|---|---|---|
| | R | D | GLASS |
| 1 | 4168.419 | 8.00 | $SiO_2$ |
| 2 | 200.360 | 6.85 | |
| 3 | 227.621 | 8.00 | $SiO_2$ |
| 4 | 129.791 | 55.00 | |
| 5 | 202.930 | 24.00 | $SiO_2$ |
| 6 | −203.575 | 1.00 | |
| 7 | 97.004 | 20.00 | $SiO_2$ |
| 8 | 376.946 | 25.00 | |
| 9 | 73.952 | 20.00 | $SiO_2$ |
| 10 | 49.693 | 45.00 | |
| 11 | −68.265 | 12.00 | $SiO_2$ |
| 12 | 324.260 | 40.00 | |
| 13 | −45.280 | 20.00 | $SiO_2$ |
| 14 | −63.048 | 1.00 | |
| 15 | −382.898 | 18.00 | $SiO_2$ |
| 16 | −105.801 | 1.00 | |
| 17 | 380.662 | 16.50 | $SiO_2$ |
| 18 | −227.226 | 1.00 | |
| 19 | 145.429 | 18.50 | $SiO_2$ |
| 20 | 1903.560 | 1.00 | |
| 21 | 87.353 | 20.00 | $SiO_2$ |
| 22 | 106.271 | | |

| Numerical Example 4 | | | |
|---|---|---|---|
| | R | D | GLASS |
| 1 | −856.710 | 8.00 | $SiO_2$ |
| 2 | 195.588 | 6.82 | |
| 3 | 256.890 | 8.00 | $SiO_2$ |
| 4 | 100.855 | 75.50 | |
| 5 | 229.819 | 24.00 | $SiO_2$ |
| 6 | −156.275 | 1.00 | |
| 7 | 111.478 | 15.00 | $SiO_2$ |
| 8 | 300.960 | 2.75 | |
| 9 | 195.798 | 17.00 | $SiO_2$ |
| 10 | 451.070 | 3.35 | |

-continued

| 11 | 95.355 | 42.00 | SiO$_2$ |
|---|---|---|---|
| 12 | 44.980 | 15.00 | |
| 13 | −118.441 | 12.00 | SiO$_2$ |
| 14 | −173.706 | 22.00 | |
| 15 | −43.484 | 40.00 | SiO$_2$ |
| 16 | −81.052 | 4.00 | |
| 17 | −9783.000 | 18.00 | SiO$_2$ |
| 18 | −117.930 | 1.95 | |
| 19 | 423.480 | 16.50 | SiO$_2$ |
| 20 | −270.027 | 2.00 | |
| 21 | 170.348 | 18.50 | SiO$_2$ |
| 22 | 329.598 | 25.00 | |
| 23 | 81.424 | 20.00 | SiO$_2$ |
| 24 | 107.270 | | |

Numerical Example 5

| | R | D | GLASS |
|---|---|---|---|
| 1 | 1682.184 | 8.00 | SiO$_2$ |
| 2 | 167.069 | 6.85 | |
| 3 | 165.830 | 8.00 | SiO$_2$ |
| 4 | 127.666 | 60.00 | |
| 5 | 195.942 | 24.00 | SiO$_2$ |
| 6 | −218.473 | 1.00 | |
| 7 | 99.751 | 20.00 | SiO$_2$ |
| 8 | 388.304 | 30.00 | |
| 9 | 76.621 | 20.00 | SiO$_2$ |
| 10 | 50.484 | 40.00 | |
| 11 | −67.422 | 12.00 | SiO$_2$ |
| 12 | 292.877 | 60.00 | |
| 13 | −48.915 | 20.00 | SiO$_2$ |
| 14 | −67.129 | 1.00 | |
| 15 | −387.231 | 18.00 | SiO$_2$ |
| 16 | −117.983 | 1.00 | |
| 17 | 307.379 | 16.50 | SiO$_2$ |
| 18 | −238.794 | 1.00 | |
| 19 | 139.999 | 18.50 | SiO$_2$ |
| 20 | 1444.435 | 1.00 | |
| 21 | 84.453 | 20.00 | SiO$_2$ |
| 22 | 97.937 | | |

Aberrations of the above numerical examples 1–5 are shown in the plots of FIGS. 3–7. In these drawings, reference character Y designates the image height, M designates the meridional image surface, and S designates the sagittal image surface.

Another form of the reduction imaging system 3 will now be described with reference to FIG. 8.

Figure 8:
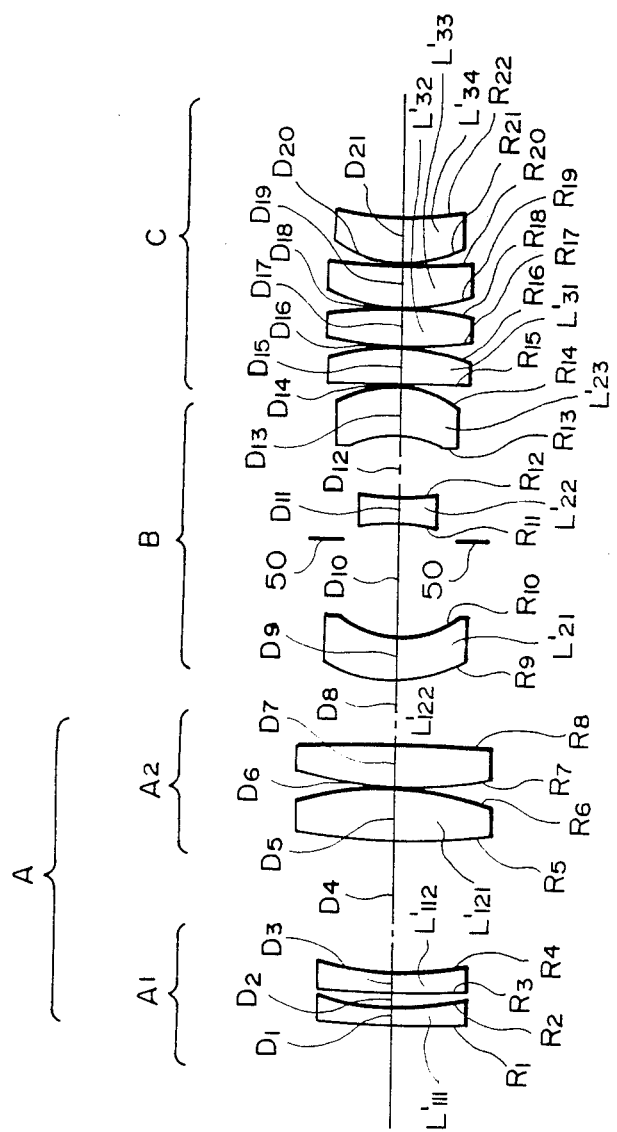
FIG. 8 is a cross-sectional view showing an imaging optical system of a projection exposure apparatus according to another embodiment of the present invention.
Figure 9:
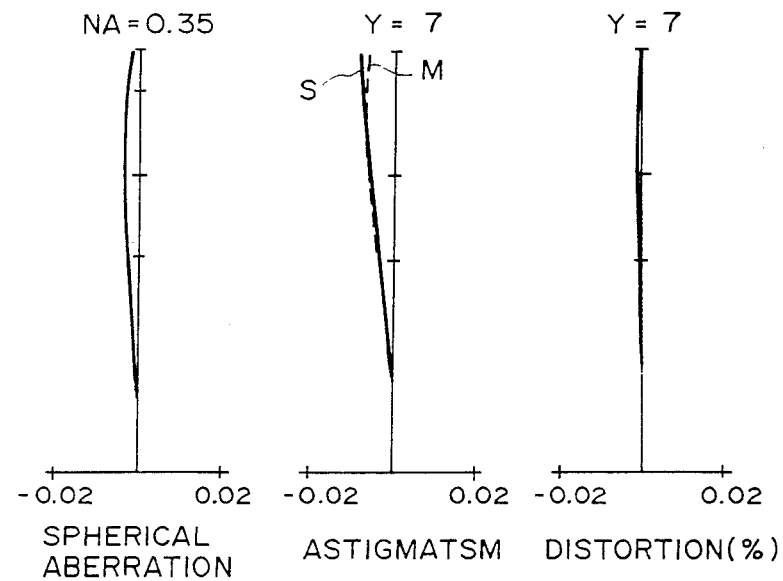
FIGS. 9–13 are plots showing aberrations in numerical examples 6–10 according to the FIG. 8 embodiment.
Figure 9:
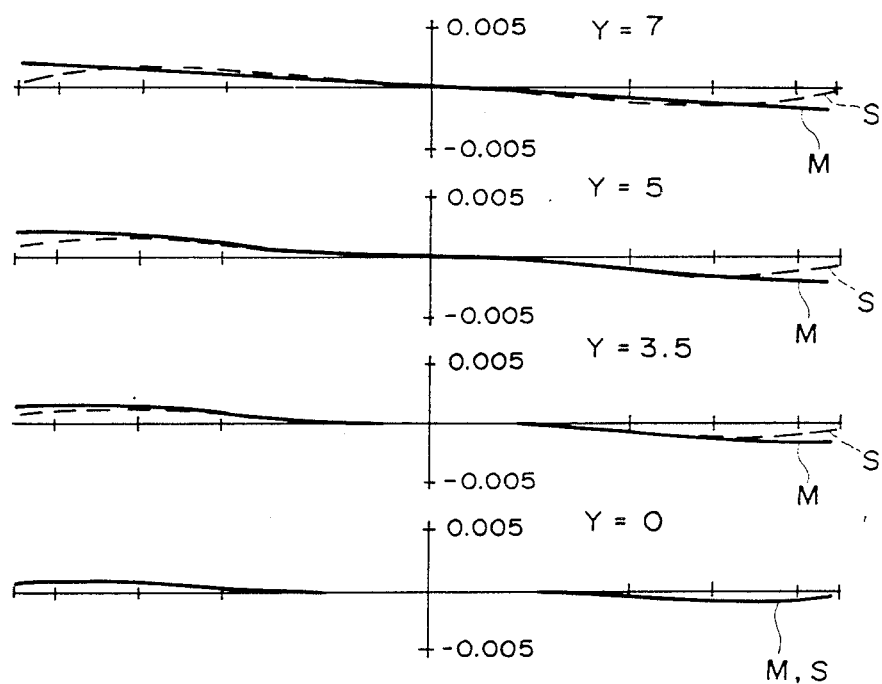
Figure 10:
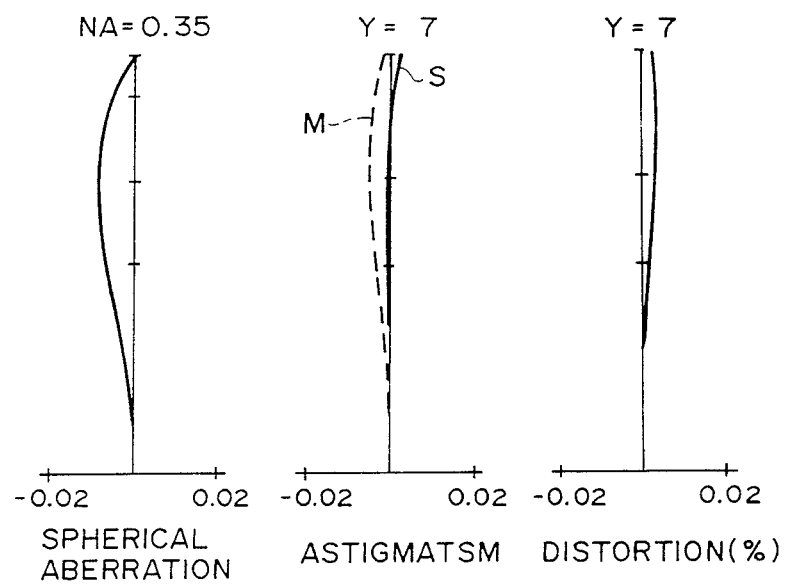
Figure 10:
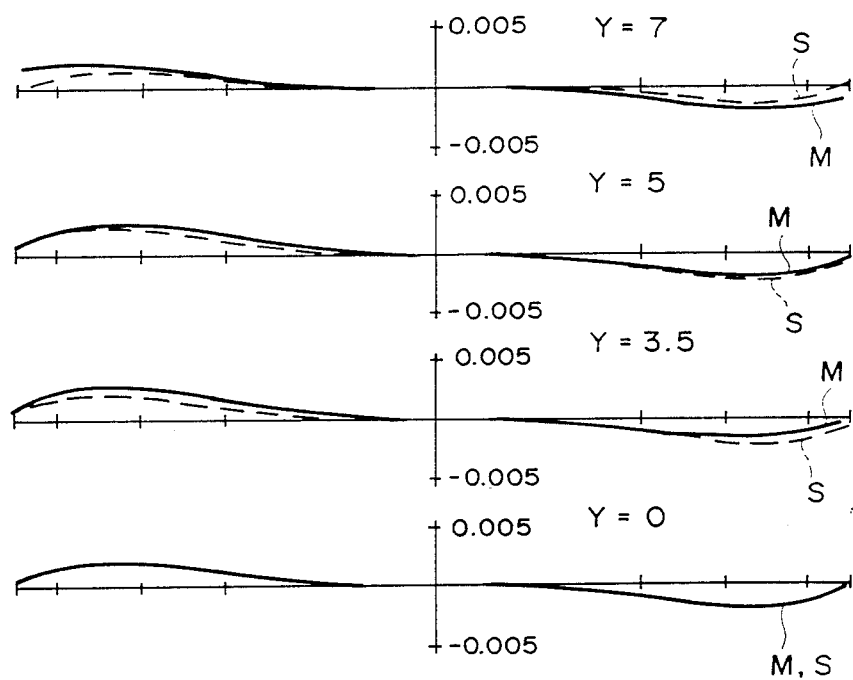
Figure 11:
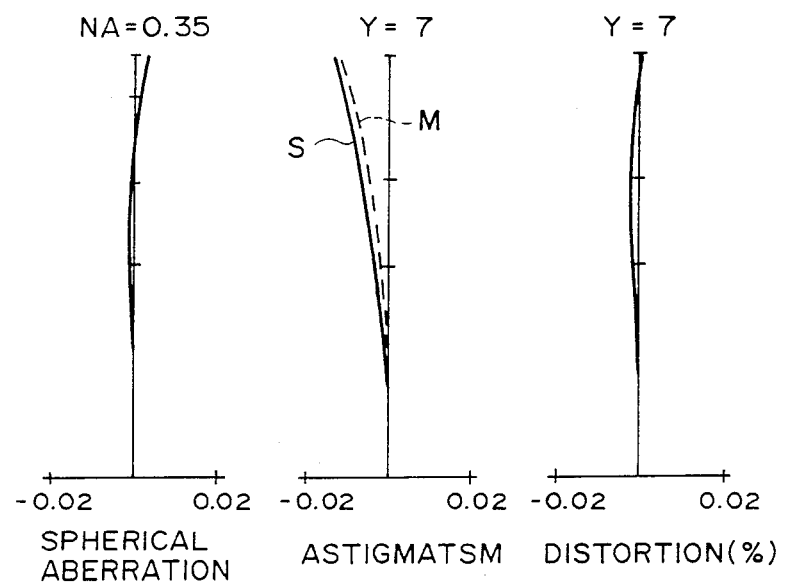
Figure 11:
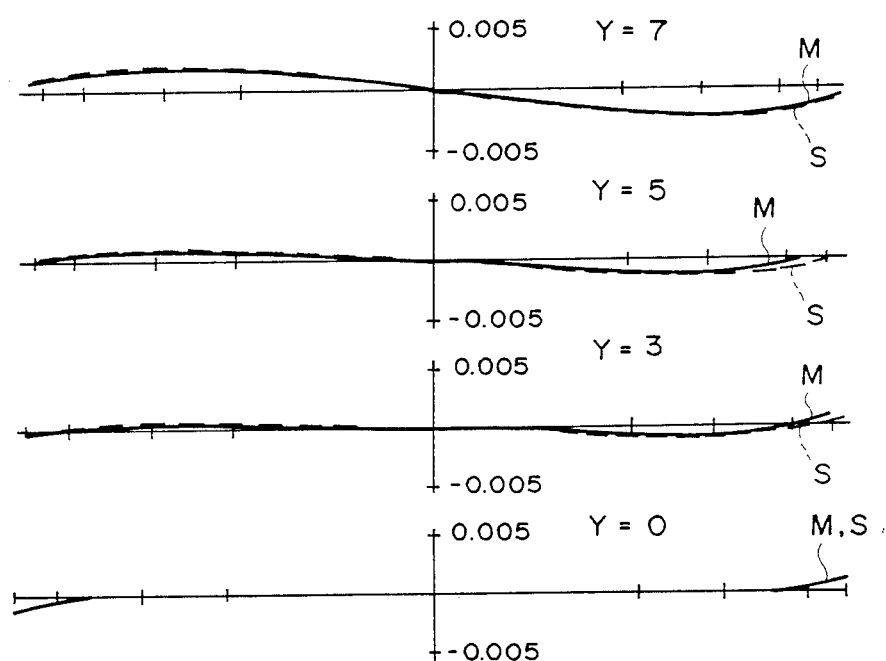
Figure 12:
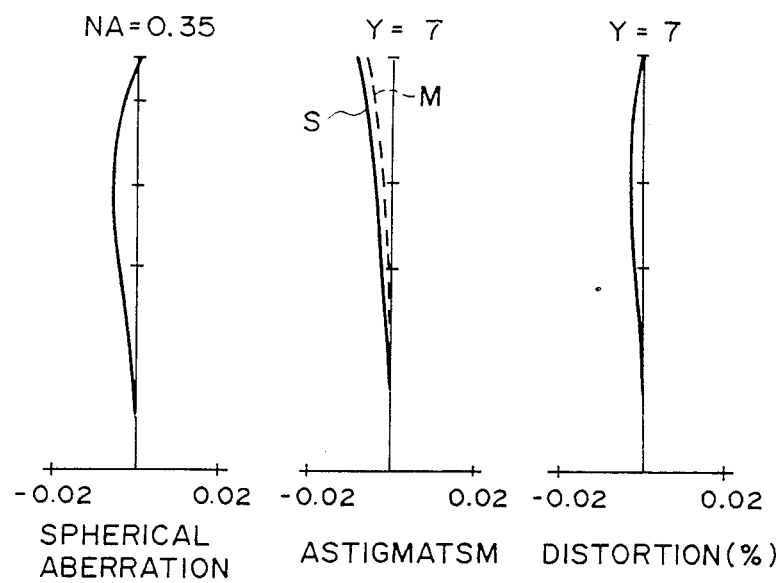
Figure 12:
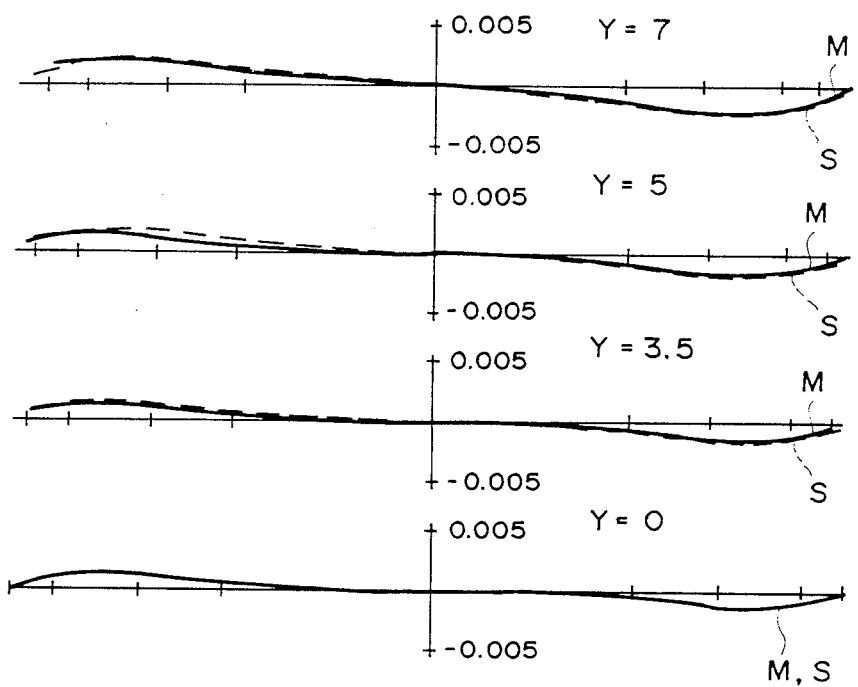
Figure 13:
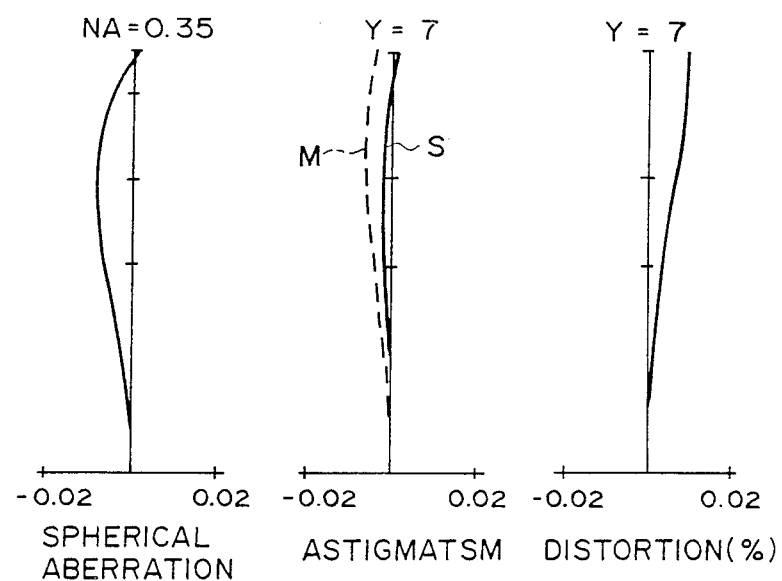
Figure 13:
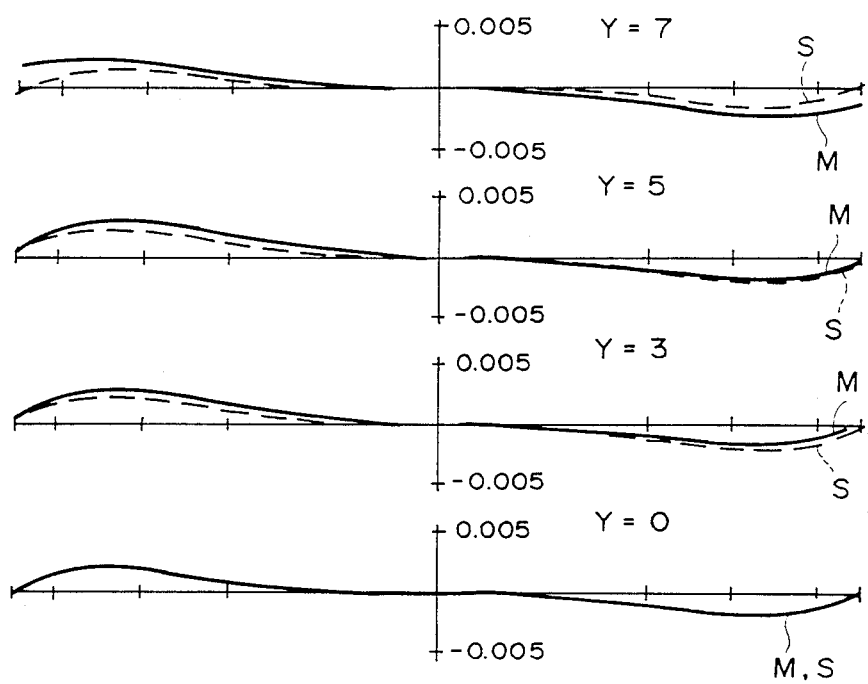

As shown in FIG. 8, the imaging system comprises, in the order from the object side to the image plane side, a first lens group A of a positive refracting power, a second lens group B of a negative refracting power and a third lens group C of a positive refracting power. The first lens group A comprises a first lens sub-group $A_1$ having a negative refracting power and a second lens sub-group $A_2$ having a positive refracting power. The first lens sub-group $A_1$ comprises at least two lenses $L'_{111}$ and $L'_{112}$ each having a negative refracting power and having a concaved surface facing to the image plane side. The second lens sub-group $A_2$ comprises a biconvex lens $L'_{121}$ and a positive refracting lens $L'_{122}$ having a convexed surface facing to the object side. The second lens group B comprises a meniscus type lens $L'_{21}$ having a negative refracting power and having a convexed surface facing to the object side, a biconcave lens $L'_{22}$ and a meniscus type lens $L'_{23}$ having a negative refracting power and having a convexed surface facing to the image plane side. The third lens group C comprises a meniscus type lens $L'_{31}$ having a positive refracting power and having a convexed surface facing to the image plane side, a biconvex lens $L'_{32}$, a positive refracting lens $L'_{33}$ having a convexed surface facing to the object side, and a meniscus type lens $L'_{34}$ of positive refracting power and having a convexed surface facing to the object side.

With this arrangement, the imaging system according to the present embodiment realizes a projection lens in which aberrations are corrected satisfactorily. Particularly, a good imaging performance is obtainable at a magnification ratio 1:10 and an angle of view not greater than 10×10 mm.

Each of the components of the present imaging system will now be described in more detail.

As has been described in the foregoing, the first lens sub-group $A_1$ is provided by at least two negative lenses each having a concaved surface facing to the image plane side, and preferably by at least two negative meniscus lenses, such as $L'_{111}$ and $L'_{112}$, each having a convexed surface facing to the object side. This is effective to correct the distortion satisfactorily over the entire picture plane. As the result, the mask pattern can be written without any distortion.

Further, by sharing out the negative refracting power of the first lens sub-group $A_1$ between these two lenses $L'_{111}$ and $L'_{112}$, a wider angle of view is achieved. As the result, the exposure area is enlarged and the throughput is improved.

The second lens sub-group $A_2$ is provided by the biconvex lens $L'_{121}$ and the positive refracting lens $L'_{122}$. By this, inwardly oriented coma and halo caused in the first lens sub-group $A_1$ are corrected, whereby a higher resolving power is attained.

The second lens group B is provided by the meniscus lens $L'_{121}$ of negative refracting power and having a convexed surface facing to the object side, the biconcave lens $L'_{22}$ and the meniscus lens $L'_{23}$ of negative refracting power and having a convexed surface facing to the image plane side. With this arrangement, negative spherical aberration and sagittal flare which appears in the area from an intermediate region to a marginal region of the picture plane, caused by the second sub-lens group $A_2$, are corrected. Particularly, the negative spherical aberration and the halo caused by the second lens subgroup $A_2$ are corrected by the lens $L'_{22}$, while the sagittal flare at the marginal area of the picture plane is corrected by the lenses $L'_{21}$ and $L'_{23}$.

The above-described arrangement of the second lens group B leads to excessive correction relative to a portion of the off-axis rays which is above the principal ray. This may cause outwardly oriented coma. In view of this, the third lens group C is provided by the meniscum lens $L'_{31}$ of positive refracting power and having a convexed surface facing to the image plane side, the biconvex lens $L'_{32}$ and the two lenses $L'_{33}$ and $L'_{34}$ of meniscus type each having a positive refracting power. This arrangement is effective to ensure a balanced correction of the outwardly oriented coma, distortion and curvature of field appearing in the area from an intermediate Portion to a marginal portion of the picture plane, caused by the second lens group.

While the present imaging system does provide a superior performance when the foregoing specifications are realized, better results are obtainable when the following conditions are satisfied:

$$1.9 < |f_1/f_2| < 3.7 \qquad (7)$$

$$0.8 < |f_2/f_3| < 1.2 \qquad (8)$$

$$1.1 < |f_{11}/f_{12}| < 2.3 \qquad (9)$$

$$1.4 < f_{111}/f_{11} < 2.2 \tag{10}$$

wherein $f_1$, $f_2$ and $f_3$ are focal lengths of the first, second and third lens groups A, B and C, respectively; $f_{11}$ and $f_{12}$ are focal lengths of the first and second lens sub-groups $A_1$ and $A_2$, respectively; and $f_{111}$ is focal length of the lens $L_{111}$.

Inequalities (7) and (8) are conditions for suitably setting the refracting powers of the lens groups, as the basic lens performance, to thereby correct the curvature of field satisfactorily over the entire picture plane. If the lower limit value of each condition is exceeded, the Petzval's sum increases so that correction of curvature of field becomes insufficient. If, on the other hand, the upper limit value is exceeded, correction of the curvature of field becomes excessive. In these cases, therefore, satisfactory correction of the aberrations over the entire picture plane would be difficult to achieve.

Inequality (9) is a condition for achieving, under the refracting power arrangement according to the conditions (7) and (8), correction of the distortion caused by the first lens sub-group $A_1$, correction of inwardly oriented coma and halo caused by the second lens sub-group $A_2$, and suppression of the curvature of field over the entire picture plane, to thereby improve the resolving power. If the lower limit value of the condition (9) is exceeded, correction of the curvature of field becomes insufficient. If, on the other hand, the upper limit value is exceeded, correction of the curvature of field becomes excessive.

Inequality (10) is a condition for suitably setting the share, in the negative refracting power, of the lens $L'_{111}$ relative to the first lens sub-group $A_1$ to correct distortion satisfactorily. If the lower limit value of the condition (10) is exceeded, correction of the distortion becomes insufficient and, if the upper limit value is exceeded, correction of the distortion becomes excessive.

In the imaging system of the present embodiment, the lens $L'_{122}$ may be of biconvex type or meniscus type having a convexed surface facing to the object side.

In a case where the first lens sub-group $A_1$ is provided by three or more lenses of meniscus type each having a negative refracting power and having a convexed surface facing to the object side, the share, in the refracting power, of each lens is suppressed. This is preferable since occurrence of coma is minimized accordingly and the effects on the other aberrations are diminished.

In a case where each of or one of the lenses $L'_{33}$ and $L'_{34}$ of the third lens group C is provided by two or more components to suppress the share in the refracting power, the coma and the curvature of field can be more satisfactorily corrected over the entire picture plane. As the result, a higher resolving power is attained.

As described above, the imaging system according to the second embodiment of the present invention realizes a projection optical system for use in a projection exposure apparatus, having a high resolving power and a superior performance.

Numerical examples of the imaging system will be shown in the following part of this Specification. In the following Numerical Examples, Ri is the radius of curvature of the "i-th" lens surface in the order from the object side, Di is the lens thickness or air space of the "i-th" element in the order from the object side, and Ni is the index of refraction of the glass material of the "i-th" lens in the order from the object side.

The glass material was a fused silica ($SiO_2$) which showed an index of refraction 1.521130 at a wavelength 248.5 nm.

The following numerical examples were under the conditions of projection ratio 1:10, numerical aperture NA=0.35, and a picture plane area of 10×10.

| Numerical Example 6 | | | |
|---|---|---|---|
| | R | D | GLASS |
| 1 | 419.004 | 8.00 | $SiO_2$ |
| 2 | 121.565 | 6.85 | |
| 3 | 575.567 | 8.00 | $SiO_2$ |
| 4 | 130.691 | 60.00 | |
| 5 | 243.521 | 24.00 | $SiO_2$ |
| 6 | −189.899 | 1.00 | |
| 7 | 178.626 | 20.00 | $SiO_2$ |
| 8 | −587.514 | 30.00 | |
| 9 | 70.167 | 20.00 | $SiO_2$ |
| 10 | 49.060 | 55.00 | |
| 11 | −80.629 | 12.00 | $SiO_2$ |
| 12 | 162.193 | 30.00 | |
| 13 | −38.345 | 20.00 | $SiO_2$ |
| 14 | −53.859 | 1.00 | |
| 15 | −486.676 | 18.00 | $SiO_2$ |
| 16 | −88.984 | 1.00 | |
| 17 | 282.794 | 16.50 | $SiO_2$ |
| 18 | −231.051 | 1.00 | |
| 19 | 120.605 | 18.50 | $SiO_2$ |
| 20 | 572.790 | 1.00 | |
| 21 | 68.110 | 20.00 | $SiO_2$ |
| 22 | 103.072 | | |

| Numerical Example 7 | | | |
|---|---|---|---|
| | R | D | GLASS |
| 1 | 444.871 | 8.00 | $SiO_2$ |
| 2 | 150.156 | 6.85 | |
| 3 | 1659.570 | 8.00 | $SiO_2$ |
| 4 | 192.927 | 20.00 | |
| 5 | 201.778 | 24.00 | $SiO_2$ |
| 6 | −198.369 | 1.00 | |
| 7 | 221.404 | 20.00 | $SiO_2$ |
| 8 | 14386.600 | 85.00 | |
| 9 | 62.746 | 20.00 | $SiO_2$ |
| 10 | 43.854 | 55.00 | |
| 11 | −123.923 | 12.00 | $SiO_2$ |
| 12 | 90.040 | 30.00 | |
| 13 | −36.999 | 20.00 | $SiO_2$ |
| 14 | −49.482 | 27.50 | |
| 15 | −519.716 | 18.00 | $SiO_2$ |
| 16 | −110.028 | 1.00 | |
| 17 | 311.390 | 16.50 | $SiO_2$ |
| 18 | −265.186 | 1.00 | |
| 19 | 121.675 | 18.50 | $SiO_2$ |
| 20 | 746.328 | 1.00 | |
| 21 | 68.122 | 20.00 | $SiO_2$ |
| 22 | 122.588 | | |

| Numerical Example 8 | | | |
|---|---|---|---|
| | R | D | GLASS |
| 1 | 13560.936 | 8.00 | $SiO_2$ |
| 2 | 222.932 | 6.85 | |
| 3 | 201.583 | 8.00 | $SiO_2$ |
| 4 | 127.682 | 60.00 | |
| 5 | 213.442 | 24.00 | $SiO_2$ |
| 6 | −197.092 | 1.00 | |
| 7 | 109.312 | 20.00 | $SiO_2$ |
| 8 | 308.248 | 30.00 | |
| 9 | 80.091 | 20.00 | $SiO_2$ |
| 10 | 49.108 | 40.00 | |
| 11 | −72.470 | 12.00 | $SiO_2$ |
| 12 | 270.667 | 55.00 | |
| 13 | −48.129 | 20.00 | $SiO_2$ |
| 14 | −63.633 | 1.00 | |
| 15 | −416.538 | 18.00 | $SiO_2$ |
| 16 | −108.697 | 1.00 | |
| 17 | 350.352 | 16.50 | $SiO_2$ |
| 18 | −246.480 | 1.00 | |
| 19 | 135.104 | 18.50 | $SiO_2$ |
| 20 | 1379.830 | 1.00 | |
| 21 | 79.637 | 20.00 | $SiO_2$ |

-continued

| 22 | 112.446 | | |

Numerical Example 9

| | R | D | GLASS |
|---|---|---|---|
| 1 | 13560.936 | 8.00 | SiO$_2$ |
| 2 | 222.932 | 6.85 | |
| 3 | 201.583 | 8.00 | SiO$_2$ |
| 4 | 127.682 | 60.00 | |
| 5 | 213.442 | 24.00 | SiO$_2$ |
| 6 | −197.092 | 1.00 | |
| 7 | 109.312 | 20.00 | SiO$_2$ |
| 8 | 308.248 | 30.00 | |
| 9 | 79.369 | 20.00 | SiO$_2$ |
| 10 | 48.750 | 40.00 | |
| 11 | −72.247 | 12.00 | SiO$_2$ |
| 12 | 248.795 | 55.00 | |
| 13 | −46.898 | 20.00 | SiO$_2$ |
| 14 | −61.747 | 1.00 | |
| 15 | −416.538 | 18.00 | SiO$_2$ |
| 16 | −108.697 | 1.00 | |
| 17 | 350.352 | 16.50 | SiO$_2$ |
| 18 | −246.480 | 1.00 | |
| 19 | 135.104 | 18.50 | SiO$_2$ |
| 20 | 1379.830 | 1.00 | |
| 21 | 79.637 | 20.00 | SiO$_2$ |
| 22 | 112.446 | | |

Numerical Example 10

| | R | D | GLASS |
|---|---|---|---|
| 1 | 422.756 | 8.00 | SiO$_2$ |
| 2 | 150.109 | 6.85 | |
| 3 | 1880.246 | 8.00 | SiO$_2$ |
| 4 | 191.730 | 20.00 | |
| 5 | 201.773 | 24.00 | SiO$_2$ |
| 6 | −198.369 | 1.00 | |
| 7 | 221.404 | 20.00 | SiO$_2$ |
| 8 | 14386.600 | 85.00 | |
| 9 | 62.746 | 20.00 | SiO$_2$ |
| 10 | 43.854 | 55.00 | |
| 11 | −123.923 | 12.00 | SiO$_2$ |
| 12 | 90.040 | 30.00 | |
| 13 | −36.999 | 20.00 | SiO$_2$ |
| 14 | −49.482 | 27.50 | |
| 15 | −519.716 | 13.00 | SiO$_2$ |
| 16 | −110.023 | 1.00 | |
| 17 | 311.390 | 16.50 | SiO$_2$ |
| 18 | −265.186 | 1.00 | |
| 19 | 121.675 | 18.50 | SiO$_2$ |
| 20 | 746.328 | 1.00 | |
| 21 | 68.124 | 20.00 | SiO$_2$ |
| 22 | 122.498 | | |

Aberration of the foregoing numerical examples 6-10 are shown in the plots of FIGS. 9-13. In these drawings, reference character Y designates the image height, M designates the meridional image surface, and S is the sagittal image surface.

In the Numerical Examples 1-10, it is a common feature that any cemented lens for correcting chromatic aberration is not included. Since the excimer lens provides a single wavelength or a very narrow wavelength range, it is not a requisition, for the purpose of correction of on-axis chromatic aberration, to provide any pair or pairs of cemented lenses in the vicinity of the plane of an aperture stop 50 (see FIGS. 2 and 8), at which the principal ray intersects with the optical axis, in a symmetrical arrangement with respect to the plane of aperture stop In other words, each of the lenses L$_{21}$ and L$_{23}$ shown in FIG. 2 and lenses L'$_{21}$ and L'$_{23}$ shown in FIG. 8 is in fact of non-cemented type.

Of course, the aperture stop 50 shown in FIG. 2 or FIG. 8 may not be a real aperture element.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:
    a light source device providing a band-narrowed excimer laser beam;
    a projection lens system for projecting a pattern of an original on a wafer, said projection lens system including a plurality of non-cemented lens elements made of different materials having sufficient transmissibility with respect to the excimer laser beam; and
    means for supporting the original and the wafer so that the pattern of the original can be projected on the wafer by said projection lens system with the excimer laser beam.

2. An apparatus according to claim 1, wherein said lens elements of said projection lens system are made of fused silica and calcium fluoride.

3. An apparatus according to claim 2, wherein said projection lens system provides a reduction imaging system.

4. An apparatus according to claim 2, wherein said light source device includes an injection-locked excimer laser.

* * * * *

UNITED STATES PATENT AND TRADEMARK OFFICE
CERTIFICATE OF CORRECTION

PATENT NO. : 4,977,426

DATED : December 11, 1990

INVENTOR(S) : RYUSHO HIROSE

It is certified that error appears in the above-identified patent and that said Letters Patent is hereby corrected as shown below:

Title Page:
AT [56] REFERENCES CITED

Other Publications, "(Goldbar et al.)," should read --(Goldhar et al.),--.

COLUMN 1

Line 35, "pulseoscillated" should read --pulse-oscillated--.

COLUMN 2

Line 48, "stepwisely" should read --stepwise--.

COLUMN 3

Line 29, "side" should read --side.--.

COLUMN 4

Line 28, "of power" should read --power of--.
    Line 32, "an" should read --a--.

COLUMN 8

Line 31, "lens $L'_{121}$" should read --lens $L'_{21}$--.
    Line 48, "meniscum" should read --meniscus--.
    Line 56, "Portion" should read --portion--.

UNITED STATES PATENT AND TRADEMARK OFFICE
CERTIFICATE OF CORRECTION

PATENT NO. : 4,977,426

DATED : December 11, 1990

INVENTOR(S) : RYUSHO HIROSE

It is certified that error appears in the above-identified patent and that said Letters Patent is hereby corrected as shown below:

COLUMN 12

Line 13, "stop" should read --stop.--.

Signed and Sealed this

Twenty-fifth Day of August, 1992

*Attest:*

DOUGLAS B. COMER

*Attesting Officer* — *Acting Commissioner of Patents and Trademarks*